United States Patent
Watanabe et al.

(10) Patent No.: US 9,991,313 B2
(45) Date of Patent: Jun. 5, 2018

(54) MAGNETIC MEMORY AND MANUFACTURING METHOD OF THE SAME

(71) Applicants: TOSHIBA MEMORY CORPORATION, Tokyo (JP); SK HYNIX, INC., Gyenoggi-Do (KR)

(72) Inventors: Daisuke Watanabe, Seoul (KR); Makoto Nagamine, Seoul (KR); Youngmin Eeh, Seoul (KR); Koji Ueda, Seoul (KR); Toshihiko Nagase, Seoul (KR); Kazuya Sawada, Seoul (KR); Yang Kon Kim, Incheon-si (KR); Bo Mi Lee, Suwon-si (KR); Guk Cheon Kim, Yeoju-si (KR); Won Joon Choi, Seoul (KR); Ki Seon Park, Seoul (KR)

(73) Assignees: TOSHIBA MEMORY CORPORATION, Tokyo (JP); SK HYNIX, INC., Gyeonggi-Do (KR)

( * ) Notice: Subject to any disclaimer, the term of this patent is extended or adjusted under 35 U.S.C. 154(b) by 0 days. days.

(21) Appl. No.: 14/656,410

(22) Filed: Mar. 12, 2015

(65) Prior Publication Data

US 2016/0099288 A1  Apr. 7, 2016

Related U.S. Application Data

(60) Provisional application No. 62/059,063, filed on Oct. 2, 2014.

(51) Int. Cl.
*H01L 27/22* (2006.01)
*H01L 43/08* (2006.01)
*H01L 43/10* (2006.01)
*H01L 43/12* (2006.01)
*H01L 29/82* (2006.01)

(52) U.S. Cl.
CPC ............ *H01L 27/228* (2013.01); *H01L 43/08* (2013.01); *H01L 43/10* (2013.01); *H01L 43/12* (2013.01); *H01L 29/82* (2013.01)

(58) Field of Classification Search
CPC ....... H01L 27/228; H01L 29/82; H01L 43/10; H01L 43/08; H01L 43/12; H01L 2924/05032; G11C 2211/5615; H01F 10/324
See application file for complete search history.

(56) References Cited

U.S. PATENT DOCUMENTS

| 8,750,029 B2 | 6/2014 | Kitagawa et al. |
| 2012/0068284 A1 | 3/2012 | Kitagawa et al. |
| 2012/0070695 A1 | 3/2012 | Kitagawa et al. |

(Continued)

OTHER PUBLICATIONS

U.S. Appl. No. 14/558,263; First Named Inventor: Yang-Kon Kim; Title: "Electronic Device"; filed: Dec. 2, 2014.

*Primary Examiner* — Yu Chen
*Assistant Examiner* — Nilufa Rahim
(74) *Attorney, Agent, or Firm* — Holtz, Holtz & Volek PC

(57) ABSTRACT

According to one embodiment, a magnetic memory includes a first magnetic layer, a second magnetic layer, a non-magnetic intermediate layer provided between the first magnetic layer and the second magnetic layer and an underlying layer provided on an opposite side of the first magnetic layer with respect to the intermediate layer, and the underlying layer contains AlN of a hcp structure.

16 Claims, 8 Drawing Sheets

(56) References Cited

U.S. PATENT DOCUMENTS

2013/0295415 A1* 11/2013 Wang ................. G11B 5/66
  428/828
2014/0131824 A1  5/2014 Kitagawa et al.

* cited by examiner

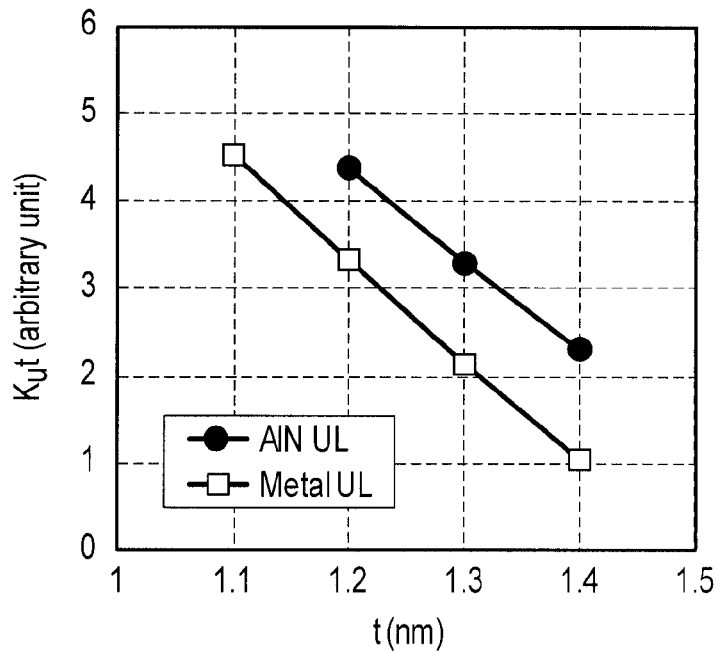
F I G. 3
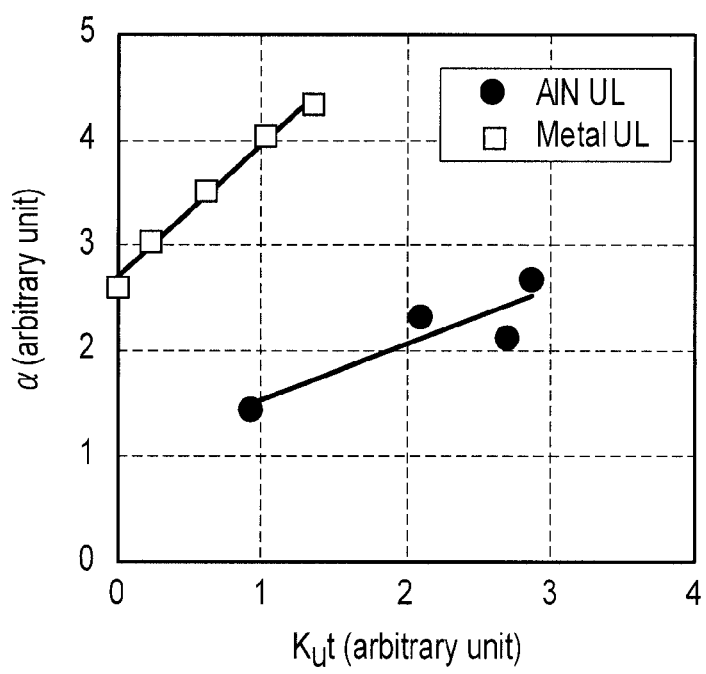
F I G. 4

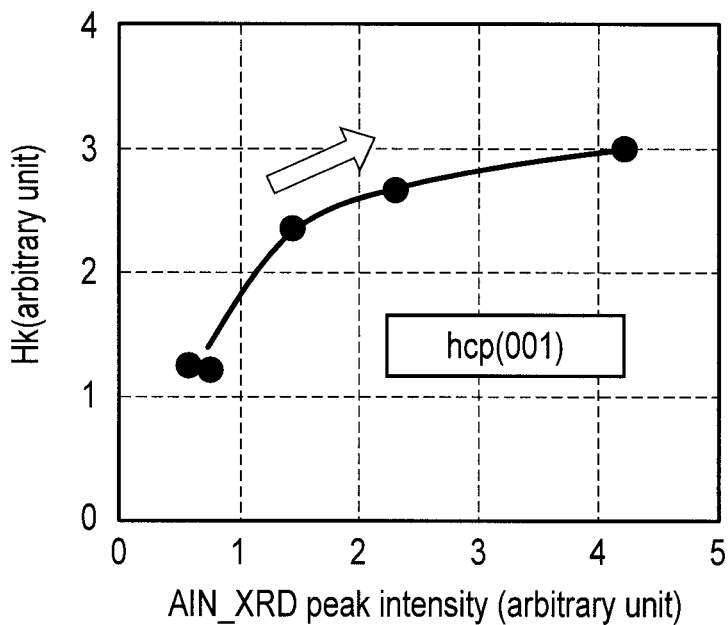
F I G. 5
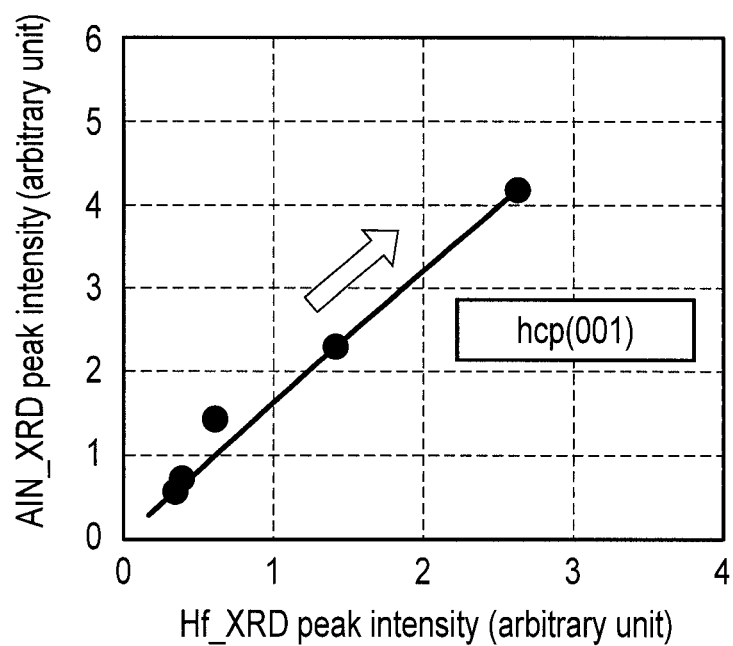
F I G. 6

|     | hcp(100) | hcp(002) |
| --- | --- | --- |
| Y   | 28.213 | 31.174 |
| Gd  | 28.599 | 30.369 |
| Tb  | 28.607 | 31.375 |
| Dy  | 28.689 | 31.66 |
| Sc  | 31.176 | 33.999 |
| Zr  | 31.927 | 34.827 |
| Mg  | 32.138 | 34.368 |
| Hf  | 32.303 | 35.457 |
| AlN | 33.209 | 36.04 |
| Ti  | 34.965 | 38.259 |
| Zn  | 36.28 | 38.984 |
| Os  | 38.02 | 41.766 |
| Ru  | 38.4 | 42.206 |
| Co  | 41.552 | 44.475 |
| Re  | 41.831 | 45.058 |
| Be  | 46.128 | 51.121 |

FIG. 15

MAGNETIC MEMORY AND MANUFACTURING METHOD OF THE SAME

CROSS-REFERENCE TO RELATED APPLICATIONS

This application claims the benefit of U.S. Provisional Application No. 62/059,063, filed Oct. 2, 2014, the entire contents of which are incorporated herein by reference.

FIELD

Embodiments described herein relate generally to a magnetic memory and a method of manufacturing the same.

BACKGROUND

In recent years, a spin-injection magnetic random access memory (MRAM) comprising a magnetoresistive element comprising a ferromagnetic material has been proposed. In the MRAM, the electric resistance of the magnetoresistive element can be set in either of a high-resistance state and a low-resistance state by changing the direction of magnetization of the magnetic layer with a current injected into the magnetoresistive element. It is required for this type of MRAM to achieve high retention and low write current.

BRIEF DESCRIPTION OF THE DRAWINGS

FIG. 3 is a characteristic diagram showing a relationship between the thickness (t) and the vertical magnetic anisotropy (Kut) of the underlying layer;

FIG. 4 is a characteristic diagram showing a relationship between the vertical magnetic anisotropy (Kut) and the dumping constant (α) of the underlying layer;

FIG. 5 is a characteristic diagram showing a relationship between the XRD peak intensity of AlN and the anisotropic magnetic field (Hk);

FIG. 6 is a characteristic diagram showing a relationship between the XRD peak intensity of Hf and the XRD peak intensity of AlN;

FIG. 15 is a diagram showing angles of X rays at which an hcp (100) peak and an hcp (002) peak appear, which are obtained when measured by X-ray diffraction.

DETAILED DESCRIPTION

In general, according to one embodiment, a magnetic memory comprises a first magnetic layer, a second magnetic layer, a non-magnetic intermediate layer provided between the first and second magnetic layers and an underlying layer provided on the first magnetic layer on an opposite side to the intermediate layer. The underlying layer contains AlN of the hcp structure.

Embodiments will now be described with reference to drawings. In the following descriptions, the structural elements having the same functions and structures will be designated by the same reference symbols, and their explanations will be repeated only when necessary. The following embodiments merely illustrate examples of devices and methods which realize the technical concepts thereof, and therefore do not specify the material, shape, structure, arrangement and the like of the structural parts to those which will be described in the following.

First Embodiment

Figure 1:
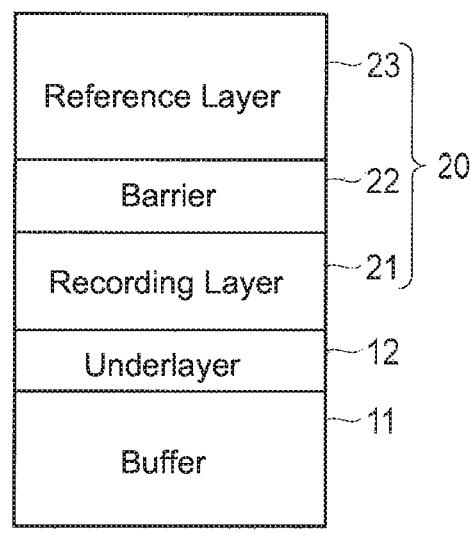
FIG. 1 is a cross-sectional view showing a structure of a magnetic memory device according to the first embodiment.

FIG. 1 is a cross-sectional view showing a brief structure of a magnetic memory device according to the first embodiment.

A buffer layer 11 is formed on a substrate (not shown). An underlying layer 12 of AlN is formed on the buffer layer 11. AlN which constitutes the underlying layer 12 has a hexagonal closest packed structure (hcp) having an (001) orientation.

An MTJ element 20 in which a non-magnetic layer is interposed between ferromagnetic layers is formed on the AlN underlying layer 12. More specifically, a recording layer (first magnetic layer) 21 comprising CoFeB is formed on the AlN underlying layer 12, a barrier layer (intermediate layer) 22 comprising MgO is formed on the CoFeB recording layer 21, and a reference layer (second magnetic layer) 23 is formed on the MgO barrier layer 22. The CoFeB recording layer 21 has a magnetic anisotropy in a direction vertical to the film surface, and the direction of magnetization thereof is variable. The CoFeB reference layer 23 has a magnetic anisotropy in a direction vertical to the film surface, and the direction of magnetization thereof is fixed.

Note although not shown in the figure that the CoFeB reference layer 23 is connected to a bit line BL via an upper electrode (TEC), and the buffer layer 11 is connected to a lower electrode (BEC).

Next, the merit of use of AlN as the underlying layer 12, which is a characteristic feature of this embodiment, will now be explained.

Figure 2A:
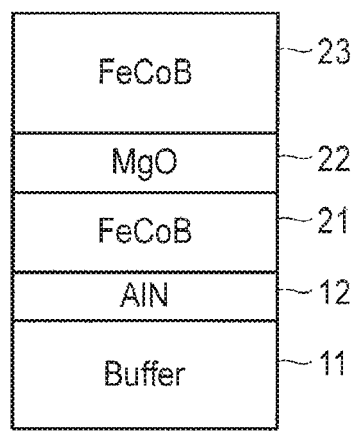
FIGS. 2A and 2B are cross-sectional views showing a structure of an underlying layer in the magnetic memory device shown in FIG. 1 as compared to a prior art example.
Figure 2B:
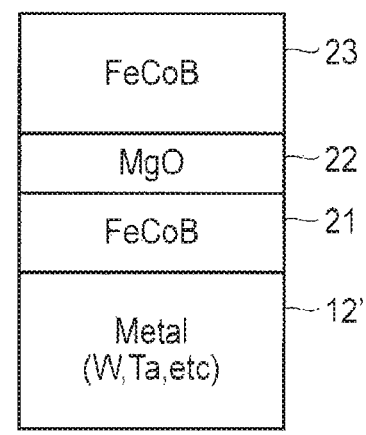

In this embodiment, a lamination structure in which the AlN underlying layer 12 is formed on the buffer layer 11 is used as an underlayer of the CoFeB recording layer 21. FIG. 2A shows an underlayer structure of the embodiment, which is an underlayer comprising a lamination of the buffer layer 11 and AlN of the hcp structure. FIG. 2B shows a comparative structure showing the case where the underlayer is a metal such as W or Ta.

For each of the cases where the underlayer is a metal and it is AlN, FIG. 3 shows the thermal stability characteristics and FIG. 4 shows the inversion current characteristics (write current characteristics). In FIG. 3, the lateral axis indicates the thickness (nm) of the CoFeB recording layer 21, and the vertical axis indicates the vertical magnetic anisotropy Kut (arbitrary unit) proportional to thermal stability Δ. In FIG. 4, the lateral axis indicates the vertical magnetic anisotropy Kut (arbitrary unit) and the vertical axis indicates the dumping constant α (arbitrary unit) proportional to inversion current Ic.

As can be understood from FIG. 3, for the same thickness t, the vertical magnetic anisotropy Kut is larger in the case where the underlayer is AlN, than in the case where it is metal. That is, when the underlayer is AlN, the thermal stability Δ (Δ∝Kut) is higher than in the case of a metal, thus making it possible to further improve the retention property. Further, as can be understood from FIG. 4, for the same vertical magnetic anisotropy Kut, when the underlayer is AlN, the dumping constant α is smaller than in the case of a metal. That is, the inversion current Ic is smaller when the underlayer is AlN than when the underlayer is a metal (Ic∝α).

As described above, when the underlayer is AlN as shown in FIG. 2A, the thermal stability Δ (Δ∝Kut) is higher for the same thickness t and the inversion current Ic is smaller for the same thermal stability.

It should be noted that when Ti or the like is added to AlN, the resistive value becomes low, but the thermal stability is lowered. In other words, when Ti or the like is not added to AlN, the thermal stability becomes the highest, but the resistive value is increased. Here, since the AlN underlying layer 12 is inserted in series with the MTJ element 20, the use of AlN as the underlying layer 12 causes an increase in element resistance. However, when the AlN underlying layer 12 is formed thin to be about 2 nm or less, the increase in element resistance caused by the insertion of the AlN underlying layer 12 does not substantially raise a problem.

When the thickness of the AlN underlying layer 12 of this embodiment is sufficiently reduced, for example, 1.5 nm or less, the element resistance RA of the AlN underlying layer 12 can be suppressed to 1 Ωμm² or less. The RA value of MgO as the barrier layer 22, which is connected in series with the AlN underlying layer 12, is about 10 Ωμm²; therefore when the RA value of the AlN underlying layer 12 is 1 Ωμm² or less, the RA value of 1 Ωμm² or less is substantially negligible.

On the other hand, the magnetic anisotropy of the magnetic materials which constitute the MTJ element, especially, the recording layer, depends on the crystallinity of the recording layer.

FIG. 5 is a characteristic diagram showing a relationship between the X-ray diffraction (XRD) peak intensity (arbitrary unit) of the AlN underlying layer 12 and the anisotropic magnetic field Hk (arbitrary unit) of the CoFeB recording layer 21. It can be understood from this figure that as the crystallinity of the AlN underlying layer 12 enhances, the magnetic anisotropy of the CoFeB recording layer 21 improves.

FIG. 6 is a characteristic diagram showing a relationship between the XRD peak intensity (arbitrary unit) of the case where, for example, Hf was used as the buffer layer 11, and the XRD peak intensity (arbitrary unit) of the AlN underlying layer 12. It can be understood from this figure that as the crystallinity of Hf improves, the crystallinity of the AlN underlying layer 12 improves.

That is, in order to improve the magnetic anisotropy of the CoFeB recording layer 21, it is important to improve the crystallinity of Hf and improve the crystallinity of the AlN underlying layer 12. It should be noted that if the AlN underlying layer 12 is excessively thin, the advantage of the excellent crystallinity of AlN is not reflected in that of the recording layer even if it is so. In order to have the excellent crystallinity of AlN reflected in that of the recording layer 21, it suffices if the thickness of the AlN underlying layer 12 is 0.2 nm or more.

Figure 7:
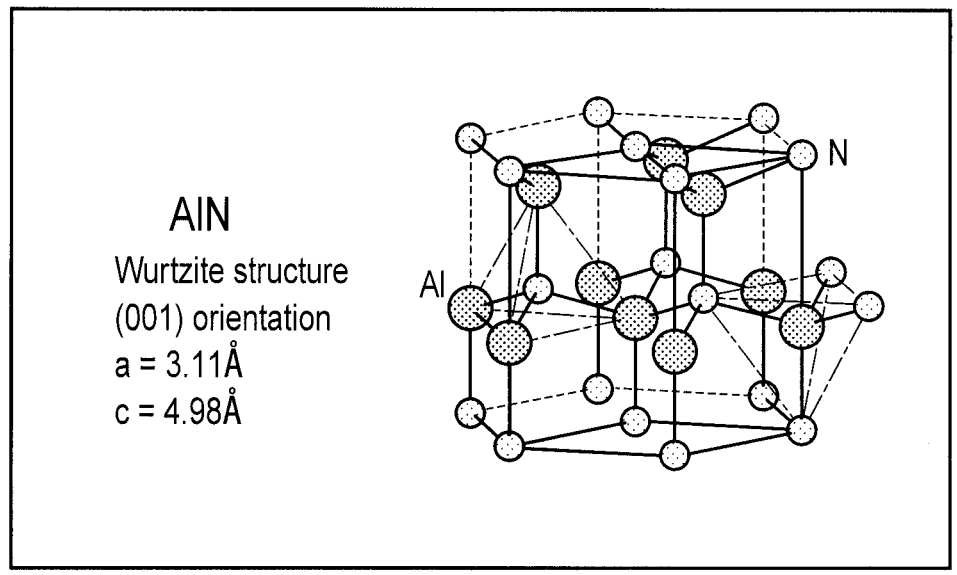
FIG. 7 is a schematic diagram illustrating a wurtzite structure of AlN, which has an (001) orientation.

FIG. 7 is a schematic diagram illustrating a crystal structure of AlN. In this example, AlN has a wurtzite-type crystal structure, which has a (001) orientation. As to the axial length, a=3.11 Å and c=4.98 Å.

Note that the hcp structure of AlN has substantially the same arrangement as that of the wurtzite structure, with a=3.20 Å and c=5.06 Å. When the image of the crystal structure of AlN is picked up under a transmission electron microscope (TEM), only Al is detected by a TEM image. In this manner, the face-to-face interval of the C-axial direction of Al can be known (about 0.22 to 0.27 nm).

Figure 8:
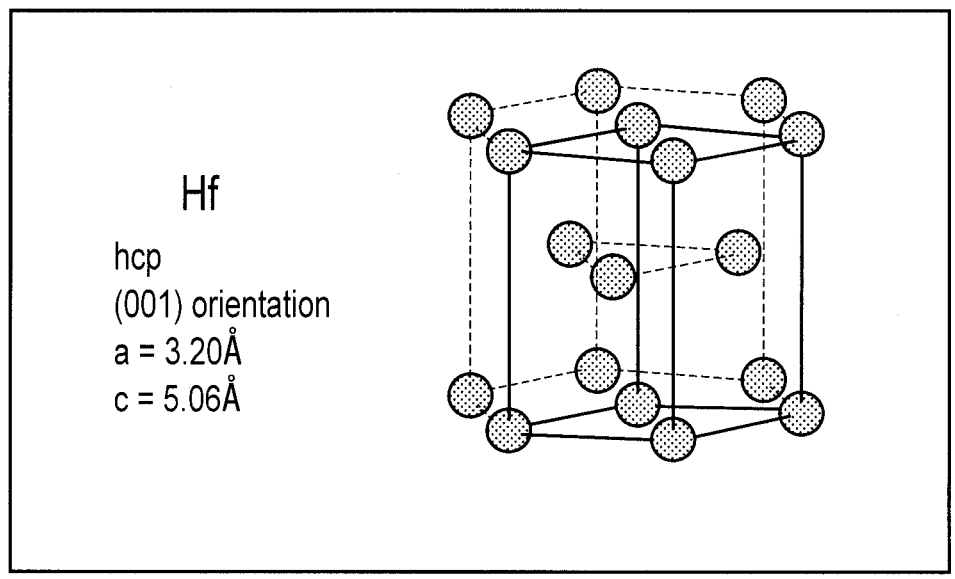
FIG. 8 is a schematic diagram illustrating an hcp structure of Hf, which has an (001) orientation.

FIG. 8 is a schematic diagram illustrating a crystal structure of Hf. In this example, Hf has an hcp crystal structure, which has an (001) orientation. As to the axial length of Hf, a=3.20 Å and c=5.06 Å.

As described above, AlN has a=3.11 Å (or 3.20 Å), whereas Hf has a=3.20 Å, and therefore AlN and Hf are close in terms of lattice constant. Thus, it is understood that there is less mismatch in lattice therebetween. In other words, a Hf having the hcp structure has a lattice constant close to that of an ideal wurtzite structure of AlN of the hcp structure. Therefore, it can be understood that, in order to have an excellent crystal structure of AlN, it suffices if Hf of the hcp structure is used as the underlying buffer layer.

Here, the material of the buffer layer 11 is not necessarily limited to Hf of the hcp structure, but, in order to form AlN with excellent crystallinity, it suffices if a material which has a less mismatch in lattice with respect to the AlN underlying layer 12 is employed.

Figure 9:
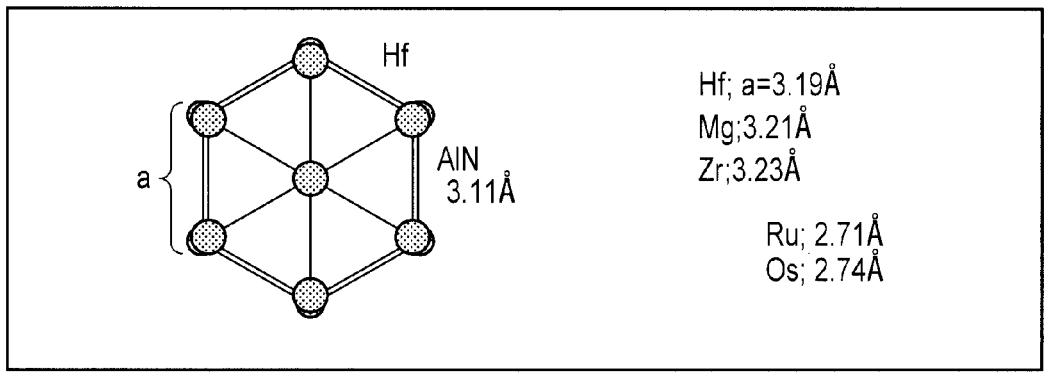
FIG. 9 is a schematic diagram illustrating an hcp structure of a buffer layer underlying AlN, which has an (001) orientation.
Figure 10:
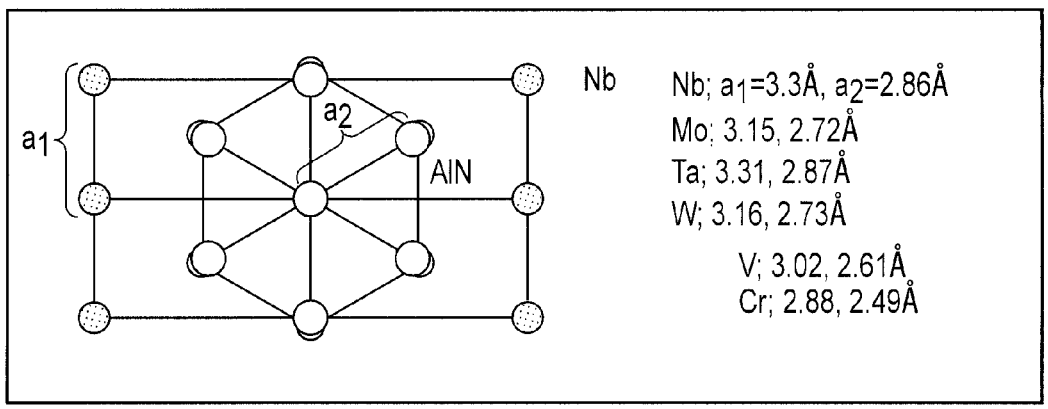
FIG. 10 is a schematic diagram illustrating an bcc structure a buffer layer underlying AlN, which has a (110) orientation.
Figure 11:
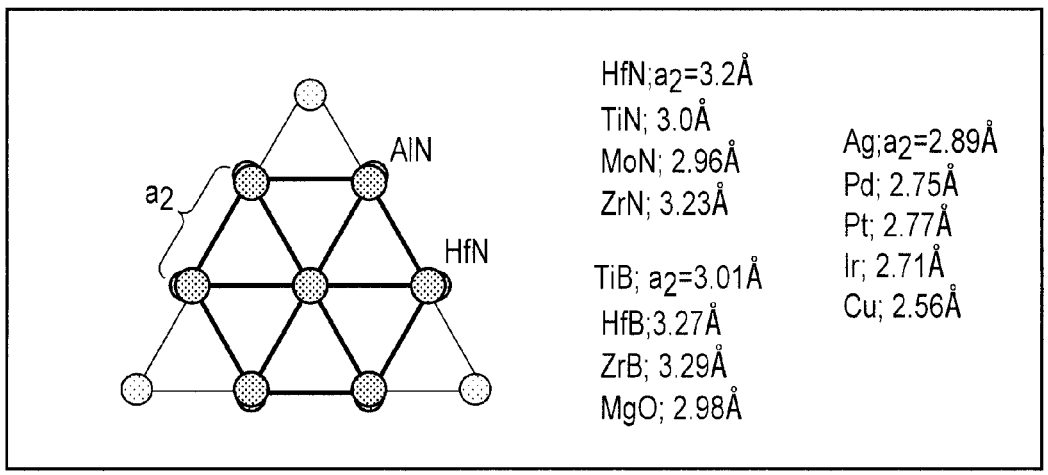
FIG. 11 is a schematic diagram illustrating an fcc structure a buffer layer underlying AlN, which has a (111) orientation.

It suffices if the buffer layer 11 has the hcp structure of the (001) orientation shown in FIG. 9, a body-centered cubic structure (bcc) of the (110) orientation shown in FIG. 10, or a face-centered cubic structure (fcc) of the (111) orientation shown in FIG. 11.

More specifically, as shown in FIG. 9, as the material for the buffer layer 11, it suffices if Hf (a=3.19 Å), Mg (a=3.21 Å) or Zr (a=3.23 Å) is employed and an hcp structure having an (001) orientation is formed. Further, alternatively, Ru (a=2.71 Å) or Os (a=2.74 Å) may as well be employed, with formation of an hcp structure having an (001) orientation.

Moreover, the authors of the embodiments have confirmed that when Zr is added to Hf as a base material for the buffer layer 11, the anisotropic magnetic field (Hk) is improved. It has been also confirmed that as the angle of X-ray is smaller, at which an hcp (002) peak appears, obtained when measured by X-ray diffraction, Hk is further improved.

From these facts, it can be expected that further excellent characteristics can be obtained when the above-listed material (Hf, Mg or Zr) is used as the base material (A) for the buffer layer 11 and an additive element (B) is added thereto. The additive element should only be that with a small angle of X-ray at which an hcp (002) peak appears, and possible examples thereof are Hf, Sc, Y, Zr, Gd, Tb and Dy.

FIG. 15 shows angles of X rays at which an hcp (100) peak and an hcp (002) peak appear, which are obtained when measured by X-ray diffraction. The value of the hcp (001) peak is the angle of X-ray obtained in the In-plane measurement, whereas the value of the hcp (002) peak is the angle of X-ray obtained in the Out-of-plane measurement. Additionally, in the Out-of-plane measurement, the detector is used while the incident ray is controlled in an angle range of 5 to 90° and thus the information on the crystal structure is obtained by X-ray diffraction. In the In-plane measurement, the incident ray is fixed at a small angle near the critical angle of total reflection (0.2 to 0.5°).

Hf and Zr, as the base material of the buffer layer 11, have an advantage of excellent flatness. Further, Hf is highly heat resisting and easily oxidizable, and therefore it also has an advantage that short-circuiting does not easily occur when attached to the sidewall of MTJ. Furthermore, the amount of the additive element (B) should desirably be 0 to 50 atomic %. Of these examples, Y and Sc are desirable in term of heat resistance.

Further, when, for example, Zr is added to Hf as the base material for the buffer layer 11, the crystallinity of Zr is improved in the case of a multi-layer structure of Zr (upper layer)/Hf (lower layer). Furthermore, in the case of HfZr alloy, the number of steps can be reduced. As the amount of Zr added is increased, the angle at which an hcp (002) peak appears becomes smeller. The angle at which an hcp (002) peak appears varies in a range of, for example, 34.7 to 35.5° depending on the amount of Zr added.

In reverse to the above, it is alternatively possible to have such a structure that Zr is used as the base material for the buffer layer 11 and Hf is added to Zr.

Further, as shown in FIG. 10, Nb (a1=3.3 Å, a2=2.86 Å), Mo (a1=3.15 Å, a2=2.72 Å), Ta (a1=3.31 Å, a2=2.87 Å) or W (a1=3.16 Å, a2=2.73 Å) may as well be employed, with formation of a bcc structure having a (110) orientation. Alternatively, V (a1=3.02 Å, a2=2.61 Å) or Cr (a1=2.88 Å, a2=2.49 Å) may as well be employed and a bcc structure having a (110) orientation is formed.

Furthermore, as shown in FIG. 11, HfN (a2=3.2 Å), TiN (a2=3.0 Å), MoN (a2=2.96 Å), ZrN (a2=3.23 Å), TiB (a2=3.3 Å), HfB (a2=3.27 Å), ZrB (a2=3.29 Å) or MgO (a2=2.98 Å) may be used, with formation of an fcc structure having a (111) orientation. Also, Ag (a2=2.89 Å), Pd (a2=2.75 Å), Pt (a2=2.77 Å), Ir (a2=2.71 Å) or Cu (a2=2.56 Å) may be used, with formation of an fcc structure having a (111) orientation. Further, NaCl having a (111) orientation may be used.

It is also expected when one of these materials are used as the base material (A) for the buffer layer 11 and one of the additives (B) listed above is added thereto that further excellent characteristics can be obtained.

In terms of improvement in crystallinity of AlN, it is desirable that the lattice mismatch of the buffer layer with respect to AlN be within 5%. Of the hcp structures mentioned above, Hf, Mg and Zr meet the criterion; of the bcc structure, Nb, Mo, Ta and W meet the criterion; and of the fcc structure, HfN, TiN, MoN, ZrN, TiB, HIS, ZrB and MgO meet the criterion.

In the meantime, the structure of the buffer layer 11 is not limited to those shown in FIGS. 9 to 11 described above, but may be a lamination structure of any of these.

As described above, according to this embodiment, AlN having the hcp structure having the (001) orientation is used as the underlying layer 12 for the CoFeB recording layer 21, and with this structure, a high thermal stability as shown in FIG. 3 and a low inversion current Ic as shown in FIG. 4 can be achieved as described above. Thus, a magnetic memory device having a high retention property and a low write current property can be achieved.

Second Embodiment

Figure 12:
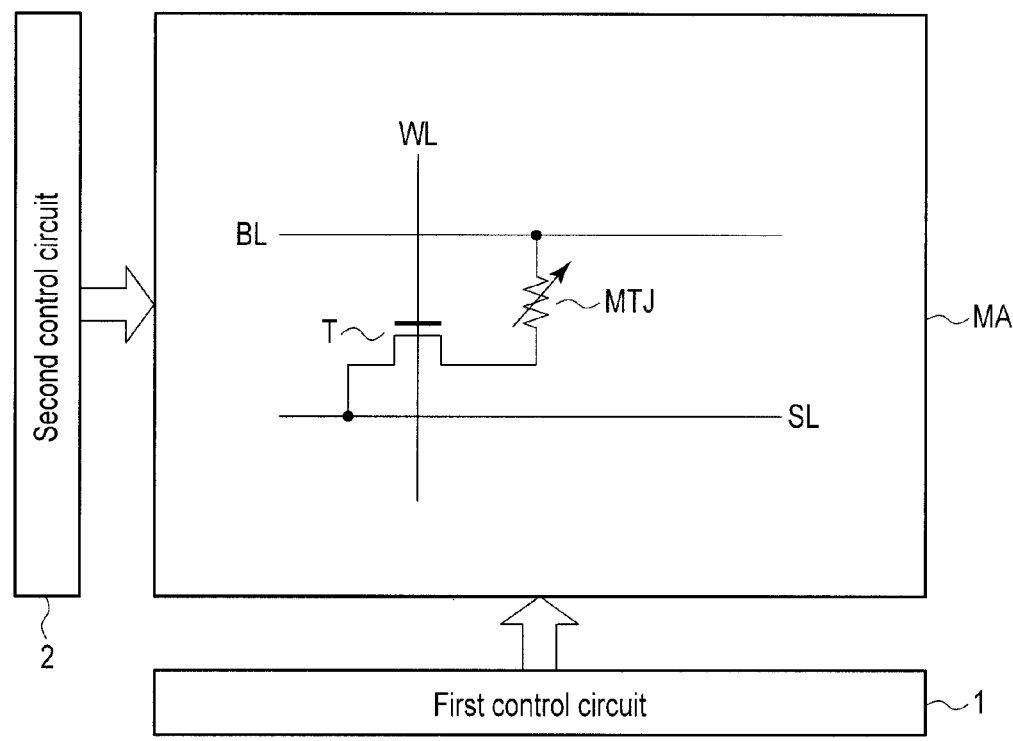
FIG. 12 is a circuit diagram showing a structure of a memory cell array of an MRAM according to the second embodiment.

FIG. 12 is a circuit diagram showing a structure of a memory cell array of an MRAM according to the second embodiment. In this embodiment, the magnetic memory device of the first embodiment described above is used as each of memory cells in the memory cell array.

A memory cell in a memory cell array MA comprises a serial connector connecting an MTJ element as a magnetic memory device and a switching element (for example, a field-effect transistor [FET]) T. One end of the serial connector (one end of the MTJ element) is electrically connected to a bit line BL, and the other end of the serial connector (one end of the switching element) is electrically connected to a source line SL.

A control terminal of the switching element T, for example, a gate electrode of the FET, is electrically connected to a word line WL. The potential of the word line WL is controlled by a first control circuit 1, whereas the potentials of the bit line BL and the source line SL are controlled by a second control circuit 2.

Figure 13:
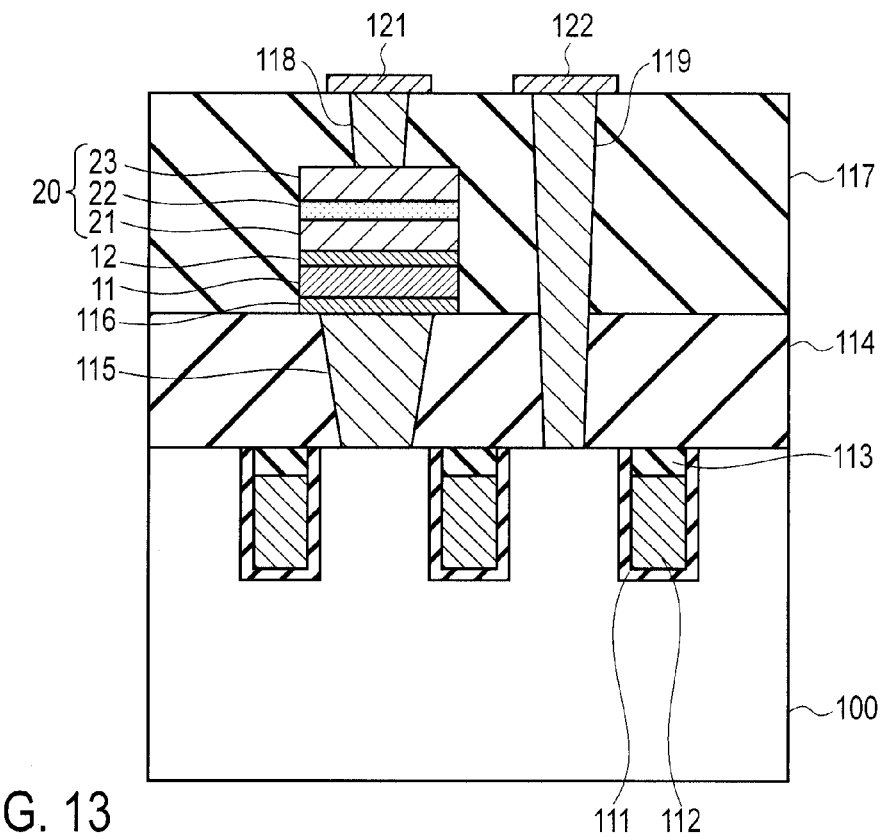
FIG. 13 is a cross-sectional view showing a structure of a memory cell portion of the MRAM shown in FIG. 12.

FIG. 13 is a cross-sectional view showing a structure of a memory cell portion of the magnetic memory device according to this embodiment.

A MOS transistor for switching is formed on a surface portion of a Si substrate 100, and an interlayer insulating film 114 of SiO$_2$ or the like is formed thereon. The transistor has a buried gate structure in which a gate electrode 112 is buried in a groove formed in the substrate 100 via a gate insulating film 111. The gate electrode 112 is buried halfway through the groove, and a protective insulating film 113 of SiN or the like is formed thereon.

Further, though not shown in the figure, p-type or n-type impurities are diffusion in the substrate 100 on both sides of the buried gate structure, thus forming source/drain regions.

Note that the structure of the transistor portion is not the buried gate structure. For example, the transistor may have a structure in which a gate electrode is formed on the surface of the Si substrate 10 via a gate insulating film. The structure of the transistor portion may be of any type as long as it can function as a switching element.

The interlayer insulating film 114 comprises a contact hole to connect to the drain of the transistor, and a lower electrode (BEC) 115 is formed and buried in the contact hole. The lower electrode 115 is, for example, Ta.

A conductive layer 116 comprising amorphous Ta is formed on the lower electrode 115. The conductive layer 116 is configured to function as a portion of the lower electrode 115, and formed especially amorphous. With the amorphous conductive layer 116, the buffer layer 11 is not affected by the underlayer, and therefore it is effective to form a hcp structure. On the conductive layer 116, the buffer layer 11, which comprises, for example, Hf of the hcp structure having a (001) orientation, is formed. The buffer layer 11 is provided to improve the crystallinity of the AlN underlying layer 12 formed thereon.

The AlN underlying layer 12 of the hcp structure having the (001) orientation is formed on the buffer layer 11. On the AlN underlying layer 12, a CoFeB recording layer (first magnetic layer) 21, which is a ferromagnetic free magnetization layer, an MgO tunnel barrier layer (intermediate layer) 22 and a CoFeB reference layer (second magnetic layer) 23, which is a ferromagnetic fixed magnetization layer, are stacked. That is, an MTJ element 20 in which the tunnel barrier layer 22 is interposed between the two ferromagnetic layers 21 and 23 is formed on the AlN underlying layer 12.

An interlayer insulating film 117 of SiO$_2$ or the like is formed on the substrate on which the MTJ element 20 is formed. In the interlayer insulating film 117, a contact plug (TEC) 118 connected to the reference layer 23 of the MTJ element 20 is buried. Further, a contact plug 119 connected to the source of the transistor portion is formed to be buried through the interlayer insulating film 117 and the interlayer insulating film 114. Further, an interconnect wire (BL) 121 connected to the contact plug 118 and an interconnect wire (SL) 122 connected to the contact plug 119 are formed on the interlayer insulating film 117.

With the above-described structure, which employs AlN of the hcp structure having the (001) orientation as the underlying layer 12 of the CoFeB recording layer 21, an MTJ element having a high retention property and a low write current property can be achieved as in the case of the first embodiment described before.

Third Embodiment

Next, a method of manufacturing a memory cell portion of an MRAM according to the second embodiment described above will now be described with reference to the third embodiment.

Figure 14A:
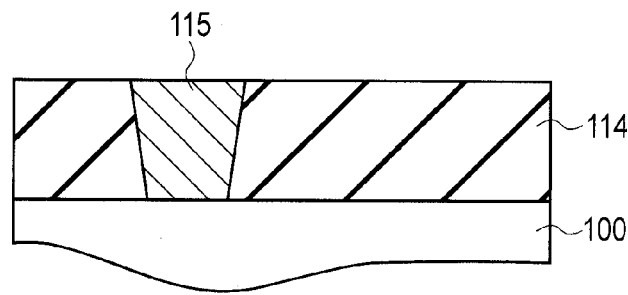
FIGS. 14A to 14C are cross-sectional views showing manufacturing steps of a memory cell portion of an MRAM according to the third embodiment.

First, as shown in FIG. 14A, a MOS transistor (not shown) for switching, which has a buried gate structure, is formed in a surface portion of an Si substrate 100, and then an interlayer insulating film 114 of $SiO_2$ or the like is deposited on the Si substrate 100 by the CVD method. Subsequently, a contact hole is made in the interlayer insulating film 114 to connect to a drain of the transistor, and then a lower electrode (BEC) 115 is formed by burying crystalline Ta in the contact hole. More specifically, a Ta film is deposited on the interlayer insulating film 114 such as to fill the contact hole by a sputtering method or the like. After that, the Ta film on the interlayer insulating film is removed by chemical mechanical etching (CMP) to leave the Ta film only in the contact hole.

Figure 14B:
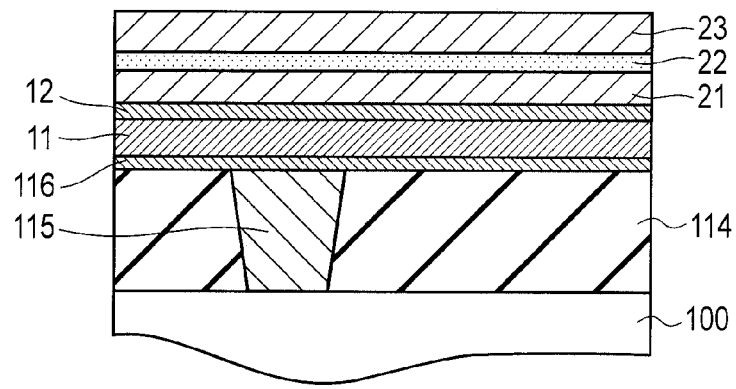

Next, the oxide film on the surface of the lower electrode 115 is removed, and then, as shown in FIG. 14B, a Ta target is subjected to DC sputtering, and thus a conductive layer 116 having a thickness of, for example, 1 nm, is formed. The conductive layer 116 is amorphous Ta. Subsequently, a sputtering target is subjected to DC sputtering, and thus a buffer layer 11 having a thickness of, for example, 5 nm, is formed on the conductive layer 116. Subsequently, an Al target is subjected to DC sputtering using Ar and N gases, and thus an AlN underlying layer 12 having a thickness of, for example, 1 nm, is formed on the buffer layer 11.

Here, a gaseous mixture of Ar and N is used for forming the AlN underlying layer 12, and the composition AlN can be freely changed by changing the mixture. That is, it is possible to prepare a composition suitable for improving the crystallinity of AlN. Before forming the underlying layer 12, the base substrate (the uppermost layer of which is the buffer layer 11) is subjected to an annealing process at 200 to 600° C. In this manner, the flatness of the interface between the buffer layer 11 and the underlying layer 12 can be improved, and accordingly the crystallinity of the underlying layer 12 can be improved. Note that, alternatively, the underlying layer 12 may be formed by sputtering while heating the base substrate in place of annealing the buffer layer 11. Further, the buffer layer 11 may be formed by sputtering while heating the base substrate (the uppermost layer of which is the Ta conductive layer 116).

After that, a CoFeB target is subjected to DC sputtering, and thus a CoFeB recording layer 21 having a thickness of, for example, 1.5 nm, is formed on the underlying layer 12. Note that the buffer layer 11, the underlying layer 12 and the recording layer 21 can be formed continuously within the same chamber by changing the target and gas. Incidentally, the quality of the recording layer 21 is degraded when it is formed at a high temperature film. In order to avoid this, if the buffer layer 11 or the underlying layer 12 is subjected to the annealing process, it is desirable that a cooling process be carried out before the formation of the recording layer 21.

Next, an MgO target is subjected to RF sputtering in a separate chamber, and thus an MgO barrier layer 22 having a thickness of, for example, 1 nm, is formed on the recording layer 21. On top of that, a CoFeB reference layer 23 having a thickness of 1.5 nm is formed by DC sputtering. That is, a lamination structure is prepared for forming an MTJ element in which ferromagnetic layers sandwich a non-magnetic tunnel barrier layer therebetween.

Figure 14C:
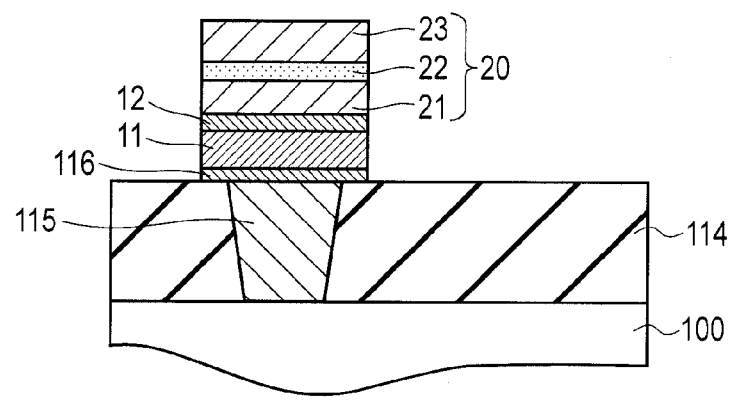

Next, as shown in FIG. 14C, the lamination portions 116, 11, 12, 21, 22 and 23 are processed into a cell pattern, and thus an MTJ element 20 is formed. More specifically, a mask of the cell pattern is formed on the CoFeB reference layer 23, and it is selectively etched by chemical dry etching (CDE), reactive ion etching (RIE) or the like to leave the lamination portions in an island fashion on the lower electrode 115.

From this step one, an interlayer insulating film 117 is formed, and then contact plugs 118 and 119 are formed. Further, interconnect wiring lines 121 and 122 are formed. Thus, the structure shown in FIG. 13 is obtained.

As described above, according to this embodiment, which employs AlN of the hcp structure as the underlying layer 12 of the MTJ element 20, a high retention property and a low write current property can be achieved. Further, by forming the buffer layer 11 underlying the AlN underlying layer 12, to have the hcp structure, the crystallinity of the AlN underlying layer 12 can be fully improved. Accordingly, the magnetic properties of the MTJ element 20 can be enhanced, thereby making it possible to achieve a high MR ratio.

Further, in this embodiment, the Al target is subjected to sputtering using an inert gas containing Ar and N when forming the AlN layer. Here, the composition of AlN can be easily varied by appropriately selecting the concentration of N in the inert gas. Thus, this embodiment has an advantage of being able to optimally set the composition of AlN by selecting an appropriate gas concentration. Further, since the buffer layer 11, the underlying layer 12 and the recording layer 21 can be formed within the same chamber by changing the sputtering target, the manufacturing time can be shortened, and the cost can be reduced.

Modified Example

The embodiments are not limited to those described above.

In the above-described embodiments, the recording layer of the MTJ element is located on the substrate side. The structure is not limited to this, but the location of the recording layer and the reference layer may be reversed. In other words, the reference layer may be located on the substrate side, whereas the recording layer may be located on an opposite side to the substrate. In this structure as well, the AlN underlying layer is inserted into the substrate side, and thus the thermal stability of the ferromagnetic layers can be improved, and the dumping constant can be lowered. Accordingly, a high retention and a low write current can be achieved in the magnetic memory device.

The material of the ferromagnetic layers, which form the recording layer and reference layer, is not necessarily limited to CoFeB, but it may be of any kind as long as it contains Co and Fe. In addition, some ferromagnetic material other than Co or Fe may be employed. Also, a shift adjusting layer or the like may be provided for relaxing and adjusting the shift of the inversion current of the recording layer, caused by the leakage magnetic field from the reference layer.

The material of the buffer layer is not limited to Hf, but it may be of any kind as long as it can promote the crystallization of the AlN underlying layer. For example, as the buffer layer, one of Mg, Zr, Nb, Mo, Ta, W, HfN, TiN, MoN, ZrN, TiB, HfB, ZrB and MgO may be employed in place of Hf. Further, a lamination film of some of these may be used. Further, in the above-described embodiments, a-Ta is used as the underlayer of Hf, but it is alternatively possible to use Nb. The annealing and cooling processes for the Hf buffer layer are not limited to how they performed as described in the above-provided embodiments, but the annealing and cooling processes may be performed at any time between the formation of the Hf layer and the formation of the CoFeB film.

Moreover, the material of the lower electrode is not limited to Ta, but it may be of any kind as long as it can be appropriately buried in the contact hole and has a sufficient conductivity, which is, for example, W, TiN or Cu in place of Ta.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory comprising:
a first magnetic layer;
a second magnetic layer;
a non-magnetic intermediate layer provided between the first magnetic layer and the second magnetic layer;
an underlying layer provided on an opposite side of the first magnetic layer with respect to the non-magnetic intermediate layer, the underlying layer containing AlN of a hcp structure; and
a buffer layer provided on an opposite side of the underlying layer with respect to the first magnetic layer;
wherein the first magnetic layer (i) is a recording layer in which a direction of magnetization is variable and (ii) is directly on the AlN of the underlying layer, and
wherein the buffer layer is of a hcp structure having a (001) orientation, a bcc structure having a (110) orientation, or an fcc structure having a (111) orientation.

2. The magnetic memory of claim 1, wherein the underlying layer has the (001) orientation.

3. The magnetic memory of claim 1, wherein the buffer layer comprises one of Hf, Mg and Zr having the hcp structure, one of Nb, Mo, Ta and W having the bcc structure, or one of HfN, TiN, MoN, ZrN, TiB, HfB, ZrB and MgO having the fcc structure.

4. The magnetic memory of claim 3, wherein the buffer layer comprises one of Hf, Sc, Y, Zr, Gd, Tb and Dy as an additive element.

5. The magnetic memory of claim 1, further comprising a lower electrode on an opposite side of the buffer layer with respect to the underlying layer.

6. The magnetic memory of claim 5, further comprising a selection transistor connected to the lower electrode.

7. The magnetic memory of claim 1, wherein the underlying layer has a thickness of 0.2 to 2 nm.

8. The magnetic memory of claim 1, wherein the second magnetic layer is a reference layer in which a direction of magnetization is invariable, and the non-magnetic intermediate layer is a barrier layer.

9. The magnetic memory of claim 8, wherein the recording layer and the reference layer are ferromagnetic materials containing one of Co, Fe and Ni, and the barrier layer comprises MgO.

10. The magnetic memory according to claim 1, wherein the buffer layer is NaCl having a (111) orientation.

11. A magnetic memory comprising:
a first magnetic layer;
a second magnetic layer;
a non-magnetic intermediate layer provided between the first magnetic layer and the second magnetic layer;
an underlying layer provided on an opposite side of the first magnetic layer with respect to the non-magnetic intermediate layer, the underlying layer containing AlN; and
a buffer layer provided on an opposite side of the underlying layer with respect to the first magnetic layer, the buffer layer comprising one selected from Hf, Mg, Zr, Nb, Mo, Ta, W, HfN, TiN, MoN, ZrN, TiB, HfB, ZrB and MgO,
wherein the first magnetic layer (i) is a recording layer in which a direction of magnetization is variable and (ii) is directly on the AlN of the underlying layer,
wherein the underlying layer has a hcp structure having an (001) orientation, and
wherein the buffer layer comprises one of Hf, Mg and Zr of an hcp structure having the (001) orientation, one of Nb, Mo, Ta and W of a bcc structure having a (110) orientation, or one of HfN, TiN, MoN, ZrN, TiB, HfB, ZrB and MgO having of an fcc structure having a (111) orientation.

12. The magnetic memory of claim 11, wherein the buffer layer comprises one of Hf, Sc, Y, Zr, Gd, Tb and Dy as an additive element.

13. The magnetic memory of claim 11, further comprising a lower electrode on an opposite side of the buffer layer with respect to the underlying layer.

14. The magnetic memory of claim 11, wherein the underlying layer has a thickness of 0.2 to 2 nm.

15. The magnetic memory of claim 11, wherein the second magnetic layer is a reference layer in which a direction of magnetization is invariable, and the non-magnetic intermediate layer is a barrier layer.

16. The magnetic memory of claim 15, wherein the recording layer and the reference layer are ferromagnetic materials containing one of Co, Fe and Ni, and the barrier layer comprises MgO.

* * * * *